US012719426B2

(12) United States Patent
Kobayashi

(10) Patent No.: US 12,719,426 B2
(45) Date of Patent: Aug. 25, 2026

(54) FIELD EFFECT TRANSISTOR (FET) TRANSCONDUCTANCE DEVICE WITH VARYING GATE LENGTHS

(71) Applicant: Qorvo US, Inc., Greensboro, NC (US)

(72) Inventor: Kevin Wesley Kobayashi, Redondo Beach, CA (US)

(73) Assignee: Qorvo US, Inc., Greensboro, NC (US)

( * ) Notice: Subject to any disclaimer, the term of this patent is extended or adjusted under 35 U.S.C. 154(b) by 498 days.

(21) Appl. No.: 18/271,027

(22) PCT Filed: Dec. 29, 2021

(86) PCT No.: PCT/US2021/073166
§ 371 (c)(1),
(2) Date: Jul. 5, 2023

(87) PCT Pub. No.: WO2022/164601
PCT Pub. Date: Aug. 4, 2022

(65) Prior Publication Data

US 2024/0056042 A1 Feb. 15, 2024

Related U.S. Application Data

(60) Provisional application No. 63/143,050, filed on Jan. 29, 2021.

(51) Int. Cl.
*H03F 3/45* (2006.01)
*H03F 1/32* (2006.01)

(52) U.S. Cl.
CPC ....... *H03F 3/45183* (2013.01); *H03F 1/3205* (2013.01); *H03F 1/3211* (2013.01);
(Continued)

(58) Field of Classification Search
CPC .. H03F 3/45183; H03F 1/3205; H03F 1/3211; H03F 2203/45134; H03F 2203/45238; H03F 2203/45498
(Continued)

(56) References Cited

U.S. PATENT DOCUMENTS 6,084,472 A * 7/2000 Gilbert .................... H03G 7/06
330/254
6,542,019 B1 4/2003 Lim et al.

OTHER PUBLICATIONS

Choi, W. et al., "Linearity by Synthesis: An Intrinsically Linear AlGaN/GaN-on-Si Transistor with OIP3/(F-1)Pdc of 10.1 at 30 GHz," 2020 Device Research Conference (DRC), Jun. 21-24, 2020, Columbus, OH, USA, IEEE, 2 pages.

(Continued)

*Primary Examiner* — Andrea Lindgren Baltzell
*Assistant Examiner* — Khiem D Nguyen
(74) *Attorney, Agent, or Firm* — Withrow & Terranova, P.L.L.C.

(57) ABSTRACT

A field effect transistor (FET) transconductance device with varying gate lengths is disclosed. In one aspect, the varying effective gate lengths are used in a differential architecture to obtain linear even and odd order operation simultaneously. In a particular aspect, the effective gate lengths may be varied according to a differential Multi-Tanh-like architecture. This variation of effective gate lengths enables a compact implementation particularly as compared to varying gate width or emitter areas while also providing linear even and odd order operation simultaneously.

19 Claims, 12 Drawing Sheets

(52) U.S. Cl.
CPC .............. *H03F 2203/45134* (2013.01); *H03F 2203/45238* (2013.01); *H03F 2203/45498* (2013.01)

(58) Field of Classification Search
USPC .......................................................... 330/253
See application file for complete search history.

(56) References Cited

OTHER PUBLICATIONS

Gilbert, B., "The Multi-Tanh Principle: A Tutorial Overview," IEEE Journal of Solid-State Circuits, vol. 33, No. 1, Jan. 1998, IEEE, 16 pages.
Hu, J. et al., "A Fully Integrated Variable-Gain Multi-Tanh Low-Noise Amplifier for Tunable FM Radio Receiver Front-End," IEEE Transactions on Circuits and Systems I, vol. 55, Issue 7, Aug. 2008, first published Feb. 2008, IEEE, pp. 1805-1814.
Kianpour, I. et al., "A Low-Power Multi-Tanh OTA with Very Low Harmonic Distortion," 2015 IEEE International Symposium on Circuits and Systems (ISCAS), May 24-27, 2015, Lisbon, Portugal, IEEE, pp. 645-649.
Kimura, K., "The Ultra-Multi-Tanh Technique for Bipolar Linear Transconductance Amplifiers," IEEE Transactions on Circuits and Systems I: Fundamental Theory and Applications, vol. 44, No. 4, Apr. 1997, pp. 288-302.
Longhi, P.E. et al., "C to V-band Cascode Distributed Amplifier Design Leveraging a Double Gate Length Gallium Nitride on Silicon Process," 2020 IEEE/MTT-S International Microwave Symposium (IMS), Aug. 4-6, 2020, Los Angeles, CA, USA, IEEE, pp. 409-412.
Moon, J.-S. et al., "High-Speed Graded-Channel GaN HEMTs with Linearity and Efficiency," 2020 IEEE/MTT-S International Microwave Symposium (IMS), Aug. 4-6, 2020, Los Angeles, CA, IEEE, pp. 573-575.
Sohel, S. et al., "Linearity Improvement With AlGaN Polarization-Graded Field Effect Transistors With Low Pressure Chemical Vapor Deposition Grown SiNx Passivation," IEEE Electron Device Letters, vol. 41, Issue 1, Jan. 2020, first published Nov. 2019, IEEE, pp. 19-22.
International Search Report and Written Opinion for International Patent Application No. PCT/US2021/073166, mailed Apr. 7, 2022, 16 pages.
Written Opinion for International Patent Application No. PCT/US2021/073166, mailed Aug. 4, 2022, 8 pages.
International Preliminary Report on Patentability for International Patent Application No. PCT/US2021/073166, mailed Oct. 4, 2022, 19 pages.

* cited by examiner

200

| | 202(1) | 202(2) | 202(3) | 202(4) | 202(5) | 202(6) |
|---|---|---|---|---|---|---|
| TYPE | $Lg_1$ | $Lg_2(+)$ | $Lg_3$ | $Lg_4(+)$ | $Lg_5$ | $Lg_6(+)$ |
| 206 Lg-Multi-Tanh 1 | 0.1 | 0.25 | 0.15 | 0.1 | 0.1 | 0.4 |
| 208 Lg-Multi-Tanh 2 | 0.1 | 0.4 | 0.20 | 0.1 | 0.1 | 0.4 |

| | | | | | | |
|---|---|---|---|---|---|---|
| TYPE | $Lg_{11}(+)$ | $Lg_{22}$ | $Lg_{33}(+)$ | $Lg_{44}$ | $Lg_{55}(+)$ | $Lg_{66}$ |
| 206 Lg-Multi-Tanh 1 | 0.25 | 0.1 | 0.1 | 0.15 | 0.4 | 0.1 |
| 208 Lg-Multi-Tanh 2 | 0.4 | 0.1 | 0.1 | 0.20 | 0.4 | 0.1 |
| | 204(1) | 204(2) | 204(3) | 204(4) | 204(5) | 204(6) |

$Lg_1 \neq Lg_{11}$
$Lg_2 = Lg_{11}$
$Lg_{22} = Lg_1$ $Lg_3 \neq Lg_{33}$
$Lg_4 = Lg_{33}$
$Lg_{44} = Lg_3$

...

$Lg_{n-1} \neq Lg_{n-1n-1}$
$Lg_n = Lg_{n-1n-1}$
$Lg_{nn} = Lg_{n-1}$

*FIG. 2A*

$$\text{Calc.IP2} \sim 10\log\left(\left|\frac{8\times10^3 R_L g_m^4}{g_m'^2}\right|\right)$$

$$\text{Calc.IP3} \sim 10\log\left(\frac{4R_L g_m^3}{\sqrt{g_m''^2 + \frac{4}{3} g_m' g_m'''}}\right)$$

FIELD EFFECT TRANSISTOR (FET) TRANSCONDUCTANCE DEVICE WITH VARYING GATE LENGTHS

PRIORITY CLAIM

The present application is a 35 USC 371 national phase filing of International Application No. PCT/US2021/073166, filed Dec. 29, 2021, which claims priority to U.S. Provisional Patent Application Ser. No. 63/143,050 filed Jan. 29, 2021 and entitled “LINEAR DIFFERENTIAL FET TRANSCONDUCTOR,” the contents of which are incorporated herein by reference in their entireties.

BACKGROUND

I. Field of the Disclosure

The technology of the disclosure relates generally to a field effect transistor (FET) configured to provide linear even and odd order operation simultaneously.

II. Background

Computing devices abound in modern society, and more particularly, mobile communication devices have become increasingly common. The prevalence of these mobile communication devices is driven in part by the many functions that are now enabled on such devices. Increased processing capabilities in such devices means that mobile communication devices have evolved from pure communication tools into sophisticated mobile entertainment centers, thus enabling enhanced user experiences. As the number and scope of the functions has increased, the need for additional bandwidth for wireless communication has also increased. Even outside the wireless communication use cases there is a need for broad bandwidth. The need for a broad bandwidth is coupled with a need for predictable (i.e., linear) behavior within the wireless communication circuitry, Such linear operation is a challenge for amplifiers operating across broad bandwidths and provides room fir innovation.

SUMMARY

Aspects disclosed in the detailed description include a field effect transistor (FET) transconductance device with varying gate lengths. The varying effective gate lengths are used in a differential architecture to obtain linear even and odd order operation simultaneously. In a particular aspect, the effective gate lengths may be varied according to a differential Multi-Tanh-like architecture. This variation of effective gate lengths enables a compact implementation particularly as compared to varying gate width or emitter areas while also providing linear even and odd order operation simultaneously.

In this regard in one aspect, a transconductor is disclosed. The transconductor comprises a first voltage level input. The transconductor also comprises a first plurality of FETs, each of the first plurality of FETs coupled to the first voltage level input and electrically parallel to one another. The first plurality of FETs comprises a first FET comprising a first source and a first effective gate length. The first plurality of FETs also comprises a second FET comprising a second source and a second effective gate length different than the first effective gate length. The transconductor also comprises a second voltage level input. The transconductor also comprises a second plurality of FETs, equal in number to the first plurality of FETs, each of the second plurality of FETs coupled to the second voltage level input and electrically parallel to one another. The second plurality of FETs comprises a third FET comprising a third source coupled to the first source and a third effective gate length equal to the second effective gate length. The second plurality of FETs also comprises a fourth FET comprising a fourth source coupled to the second source and a fourth effective gate length equal to the first effective gate length.

BRIEF DESCRIPTION OF THE DRAWINGS

FIG. 2A is a table showing how effective gate length may be varied according to an exemplary aspect of the present disclosure;

DETAILED DESCRIPTION

Figure 1:
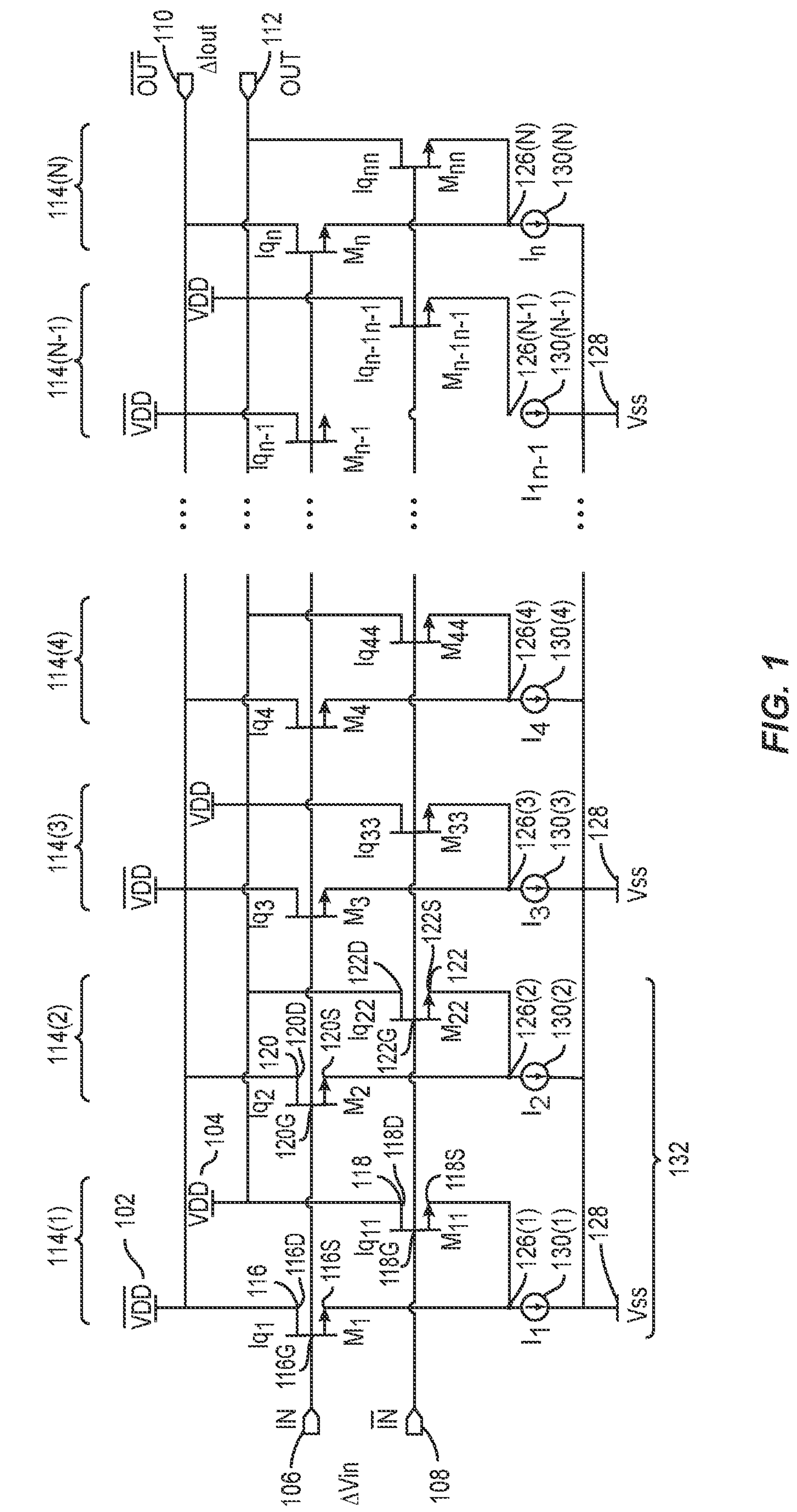
FIG. 1 is a circuit diagram of an exemplary differential linear field effect transistor (FET) transconductor with varying effective gate length (Lg)

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms, used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a field effect transistor (FET) transconductance device with varying gate lengths. The varying effective gate lengths are used in a differential architecture to obtain linear even and odd order operation simultaneously. In a particular aspect, the effective gate lengths may be varied according to a differential Multi-Tanh-like architecture. This variation of effective gate lengths enables a compact implementation particularly as compared to varying gate width or emitter areas while also providing linear even and odd order operation simultaneously.

Before addressing exemplary aspects of the present disclosure, a brief overview of traditional approaches is provided. Specifically, several industries, both extant and proposed, rely on linear differential FET based amplifiers. With emerging standards, these linear differential FET based amplifiers should operate over a wide bandwidth (e.g., greater than an octave) while maintaining even and odd order linearity. Such industries include fifth generation (5G) and proposed sixth generation (6G) millimeter integrated circuits (MMIC) for phased arrays, fiber optic optical-to-electrical (O/E) and electrical-to-optical (E/O) linear drivers and transimpedance amplifiers (TIAs), satellite communications, and cable television devices amongst others.

Devices in these industries may face unfilterable in-band distortion and accordingly focus on shaping transconductance (Gm) and its derivatives (Gm', Gm") to achieve improved third order intercept points (IP3), third order intermodulation (IM3) or odd order linearity to reduce this in-band distortion. A variety of techniques have been proposed and used. However, solutions to date involve a tradeoff between optimizing between second order intercept points (IP2) and IP3. Most techniques to optimize IP2 involve techniques that are the antithesis of optimizing IP3 and vice versa. Accordingly, there is room for improvement that provides a better balance between IP2 and IP3.

Exemplary aspects of the present disclosure employ a Multi-Tanh differential linear FET transconductor with varying effective gate lengths in the FETs to achieve a device that balances IP2 and IP3 and maintains relatively linear operation at the first and second derivatives of Gm. For the sake of clarity, a Multi-Tanh device is a device that is composed of a plurality of individually non-linear devices, but that overall achieves a linear transfer function. In the present case, the devices are FETs and the differences between the devices are made by varying the effective gate lengths such that the overall transconductor has both even order and odd order linear operation over the frequencies of interest. Additional performance improvements may be made by selectively changing a gate width of the FETs.

The second order linearity is improved by using the differential structure and the Multi-Tanh structure. The third order linearity is provided by individually adjusting the devices as explained in greater detail below.

In this regard, FIG. 1 is a circuit diagram of a Multi-Tanh differential linear FET transconductor 100. The transconductor 100 is a differential structure and includes a first voltage level input ($\overline{\text{VDD}}$) 102 and a second voltage level input (VDD) 104. The transconductor 100 may further include a first common input node (IN) 106 and a second common input node ($\overline{\text{IN}}$) 108, which collectively form a differential input. The transconductor 100 may further include a first common output node ($\overline{\text{OUT}}$) 110 and a second common output node (OUT) 112, which collectively form a differential output.

Between the differential input and the differential output are a plurality of differential amplifiers 114(1)-114(N). Each differential amplifier 114(1)-114(N) includes two FETs. By way of example, the first differential amplifier 114(1) may include a first FET ($M_1$) 116 and a second FET ($M_{11}$) 118. The second differential amplifier 114(2) may include a third FET ($M_2$) 120 and a fourth FET ($M_{22}$) 122. In an exemplary aspect, the FETs may be made from gallium nitride (GaN), although other materials may be used as needed or desired. Note that first-fourth and other sorts of ordinal designations are matters of convenience and may be rearranged without departing from the scope of the present disclosure.

It should be appreciated that each FET has a corresponding gate (e.g., gate 116G, 118G, 120G, 122G), a corresponding drain (116D, 118D, 120D, 122D), and a corresponding source (116S, 1185, 120S, 122S). In an exemplary aspect, the sources of the FETs within a given differential amplifier 114(1)-114(N) are coupled. Thus, for example, the source 116S is coupled to the source 1185, and the source 120S is coupled to the source 122S. This coupling puts the coupled sources at a common potential. This coupling may also be made through a respective resistor or inductor (neither shown). Thus, the source 116S and the source 1185 are coupled at a common potential 126(1), and each differential amplifier 114(1)-114(N) has a respective common potential 126(1)-126(N). In an exemplary aspect, the common potential 126(1)-126(N) may be a virtual ground. The common potential 126(1)-126(N) may be coupled to a ground 128 (or a set direct current (DC) supply voltage level such as Vss) through a current source 130(1)-130(N), The current sources 130(1)-130(N) may be independently controlled to vary current values so as to optimize linearity as needed. Alternatively, instead of a current source 130(1)-130(N), a resistor (not shown) may be positioned between the common potential 126(1)-126(N) and the ground 128.

More relevant to the present disclosure, the gates of the FETs have dimensions such as a gate width (WO and an effective gate length (Lg). As better explained with reference to FIGS. 3-6 below, the geometries of the FET may change what elements contribute to the gate dimension properties, and thus, an effective gate length is defined in greater detail after some of these variations are explored below. Exemplary aspects of the present disclosure vary the effective gate length in a differential Multi-Tanh-like architecture to achieve better linear even and odd order operation simultaneously. FIG. 2A provides some additional details about exemplary effective gate length variations, but in general, FETs within a given differential amplifier 114(1)-114(N) may have different effective gate lengths, and FETs within a given pair of differential amplifiers may have some common effective gate lengths shared thereamongst. For example, a quad 132 may be formed from the differential amplifiers 114(1), 114(2) and $Lg_1$ may equal $Lg_{22}$; $Lg_2$ may equal $Lg_{11}$, but $Lg_1 \neq Lg_{11}$ and $Lg_2 \neq Lg_{22}$. In an exemplary aspect, N is an even number such that each differential amplifier 114(1)-114(N) is within a quad, but the present disclosure is not so limited, and a lone differential amplifier 114(N) may be present that does not belong to a quad.

In an exemplary aspect, a first plurality of FETs ($M_1$-$M_N$) is coupled to the first voltage level input 102 and are electrically parallel to one another. Likewise, a second plurality of FETs ($M_{11}$-$M_{NN}$) is coupled to the second voltage level input 104 and are electrically parallel to one another. The gates of the first plurality of FETs are likewise coupled to the first common input node 106. The gates of the second plurality of FETs are coupled to the second common input node 108, The drains of the first plurality of FETs are coupled to the first common output node 110. The drains of the second plurality of FETs are coupled to the second common output node 112.

As noted above, exemplary aspects of the present disclosure contemplate varying Lg of the various FETs in a differential Multi-Tanh-like architecture. FIG. 2A provides a table 200 of exemplary values for a twelve finger (N=6) device for two Multi-Tanh configurations. In particular, the columns 202(1)-202(6) provide the lengths for the first plurality of FETs and columns 204(1)-204(6) provide lengths for the second plurality of FBI's. The row 206 shows a first configuration, with moderate adjustments to the various lengths, and row 208 shows a second configuration with more exaggerated adjustments to the various lengths. The dimensions of the entries within the table 200 are in micrometers (μm).

As noted above, in either configuration, within a quad, $Lg_1$ may equal $Lg_{22}$; $Lg_2$ may equal $Lg_{11}$, but $Lg_1 \neq Lg_{11}$ and $Lg_2 \neq Lg_{22}$. Thus, in the first configuration, $Lg_1$ may equal $Lg_{22}$=0.1 μm; $Lg_2$ may equal $Lg_{11}$=0.25 μm, and $Lg_1 \neq Lg_{11}$ and $Lg_2 \neq Lg_{22}$. The values may be chosen so that the overall second order transconductance is linear. Note further, that the present disclosure also contemplates that at least one differential amplifier 114(1)-414(N) may have equal effective gate lengths. This differential amplifier may be part of a quad, in which case, all four FETs within the quad have equal effective gate lengths, or it may be a lone pair.

Figure 2B:
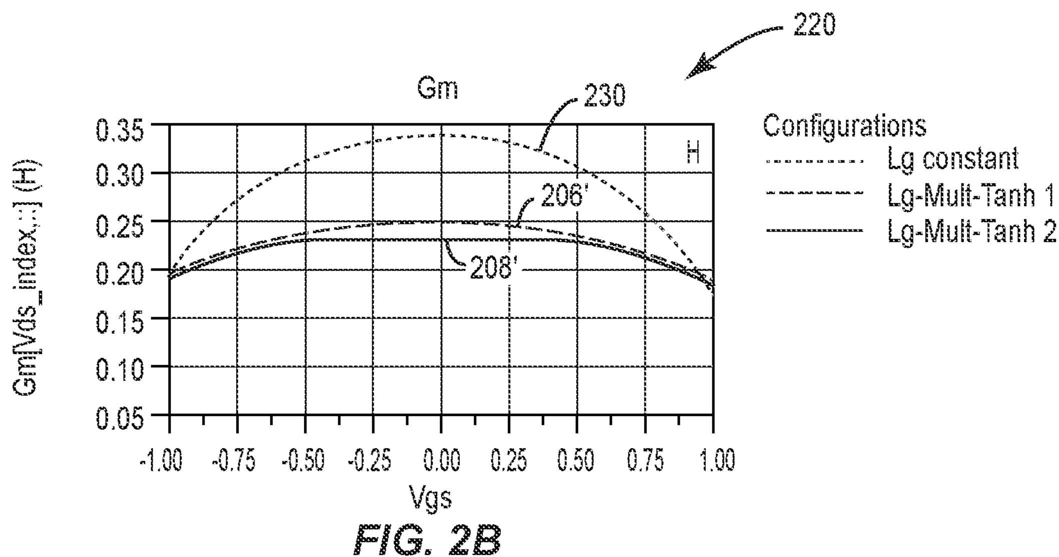
FIGS. 2B-2G are graphs comparing performance characteristics of a conventional transconductor relative to two different transconductors formulated according to the parameters set in FIG. 2A.

The improved performance of a transconductor 100 made according to either configuration set forth in table 200 relative to a conventional device is illustrated graphically by graphs 220-225 in FIGS. 2B-2G. Specifically, graph 220 in FIG. 2B shows the transconductance of the first configuration with line 206' and the transconductance of the second configuration with line 208'. Lines 206' and 208' are relatively linear, especially as compared to line 230 that shows the transconductance of a conventional device.

Figure 2C:
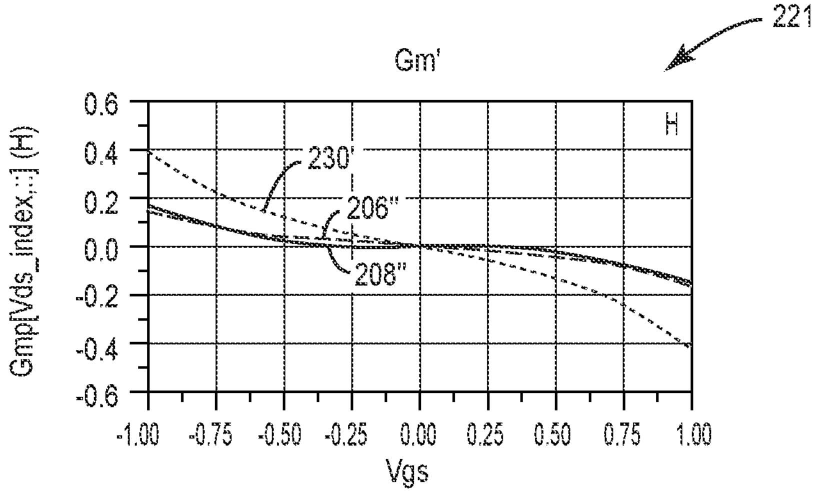

Similarly, the second order transconductance (Gm') is shown by graph 221 in FIG. 2C. Line 206" and line 208" correspond to the first configuration and second configuration, respectively, while line 230' shows the performance of a conventional device. Again, lines 206" and 208" are substantially more linear than line 230'.

Figure 2D:
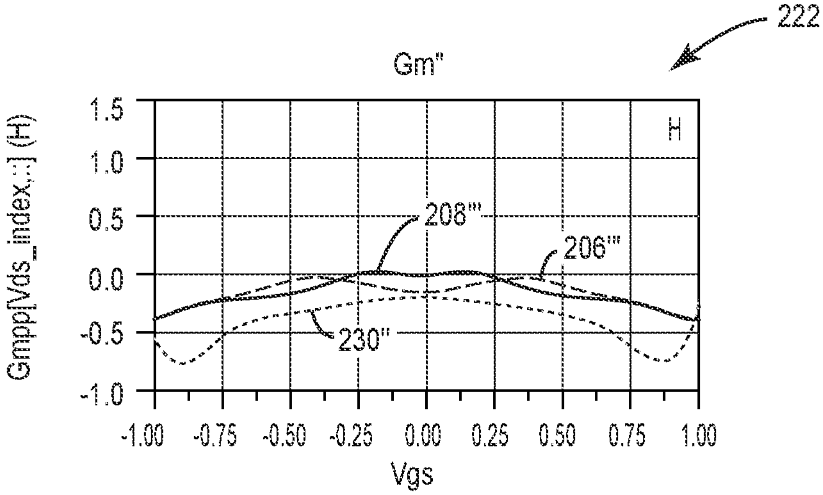

Similarly, the third order transconductance (Gm") is shown by graph 222 in FIG. 2D. Line 206''' and line 208''' correspond to the first configuration and second configuration, respectively, while line 230''' shows the performance of a conventional device. Again, lines 206''' and 208''' are substantially more linear than line 230".

Figure 2E:
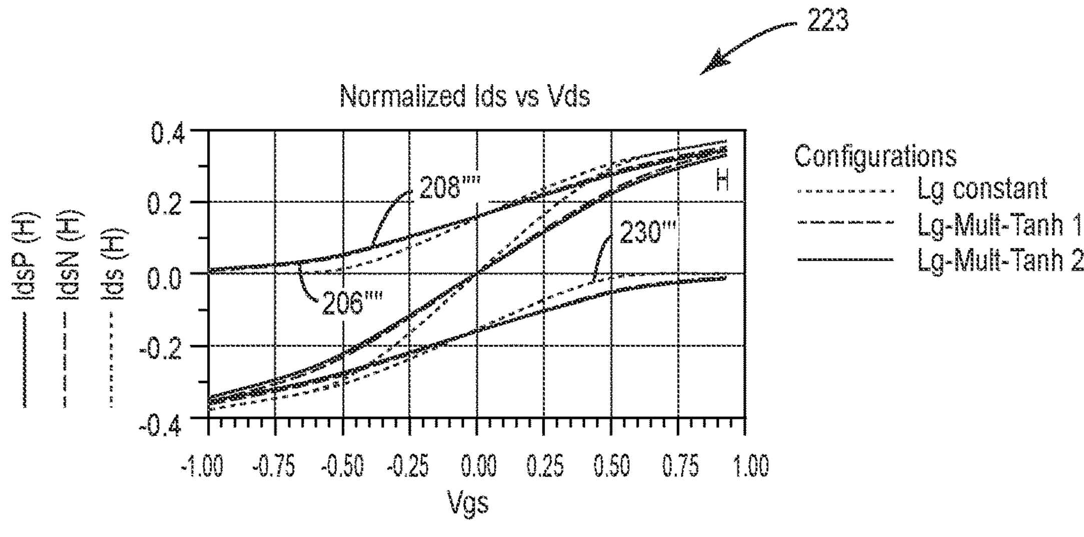

Similarly, a normalized Ids (current between drain and source) versus Vgs (voltage across gate and source) is shown by graph 223 in FIG. 2E. Line 206"" and line 208"" correspond to the first configuration and second configuration, respectively, while line 230''' shows the performance of a conventional device. Again, lines 206"" and 208"" show slight improvement over line 230'''.

Figure 2F:
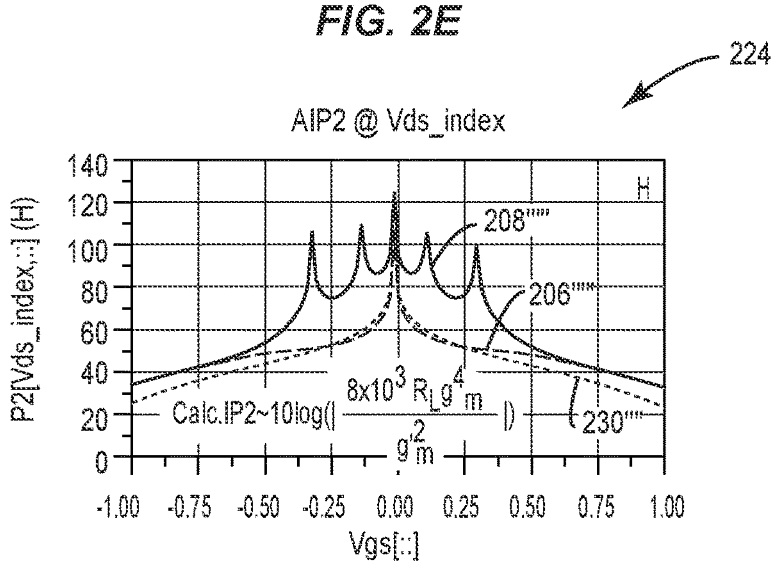

Similarly, the second order intercept point (IP2) is shown by graph 224 in FIG. 2F, Line 206''''' and line 208''''' correspond to the first configuration and second configuration, respectively, while line 230'''' shows the performance of a conventional device. While line 206''''' is relatively close to line 230'''', line 208''''' has a substantially broader IP2 as desired.

Figure 2G:
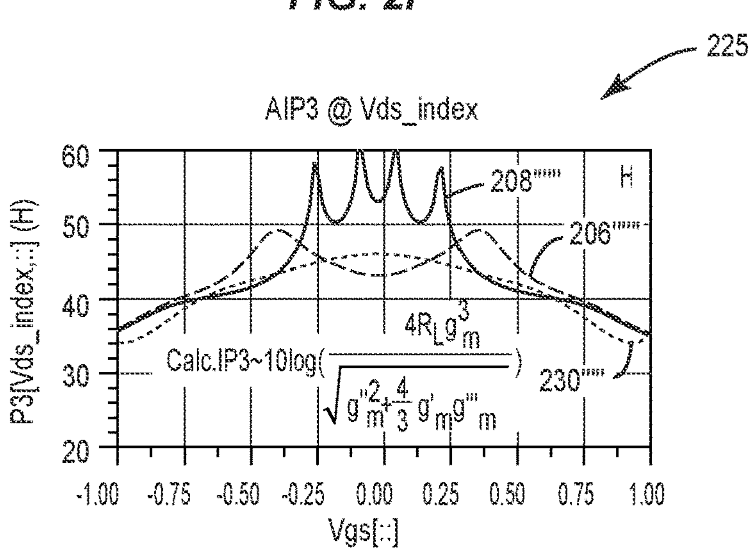
Figure 2H:
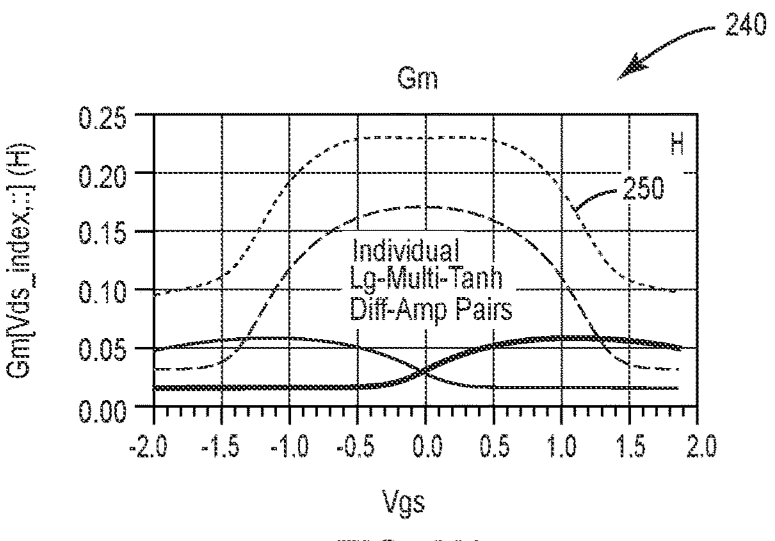
FIGS. 2H-2M are graphs showing the individual paired transistor responses that collectively form one of the lines (i.e., Mult-Tanh 2) provided in the graphs in FIGS. 2B-2G.

Similarly, the third order intercept point (IP3) is shown by graph 225 in FIG. 2G. Line 206"'''' and line 208"'''' correspond to the first configuration and second configuration, respectively, while line 230''''' shows the performance of a conventional device. Line 206"'''' has two peaks reflecting some desired broadening relative to the shape of line 230''''', but line 208"'''' has a much higher and acceptably broad width as desired.

From comparison of data corresponding to that presented in graphs 221-225, a desired performance may be selected for the transconductor 100 and values of the Multi-Tanh function selected accordingly.

Additional information about the differential pairs may be found in FIGS. 2H-2M, Specifically, the second configuration Gm (S/mm) (graph 240, FIG. 2H), Gm' (A/$V^2$-mm) (graph 241, FIG. 2I), Gm" (A/$V^3$-mm) (graph 242, FIG. 2J), Ids (A/mm) (graph 243, FIG. 2K), and calculated IP2 (dBm)

(graph 244, FIG. 2L), and IP3 (dBm) (graph 245, FIG. 2M) responses are shown for each of the individual differential amplifier pairs.

Figure 2I:
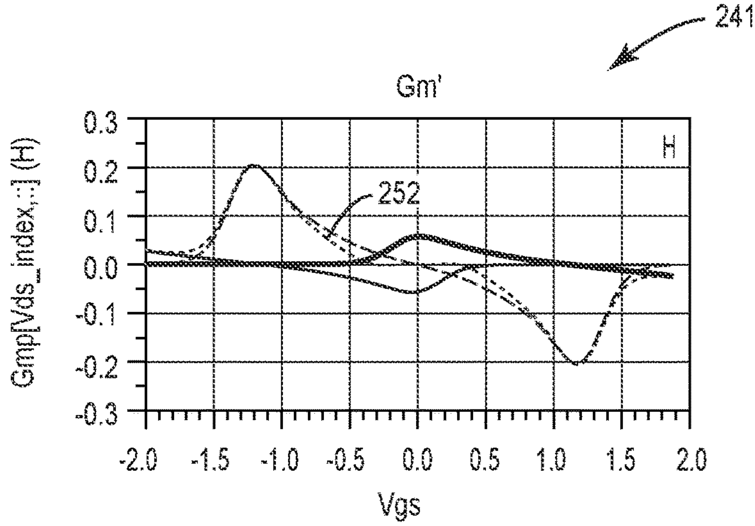
Figure 2J:
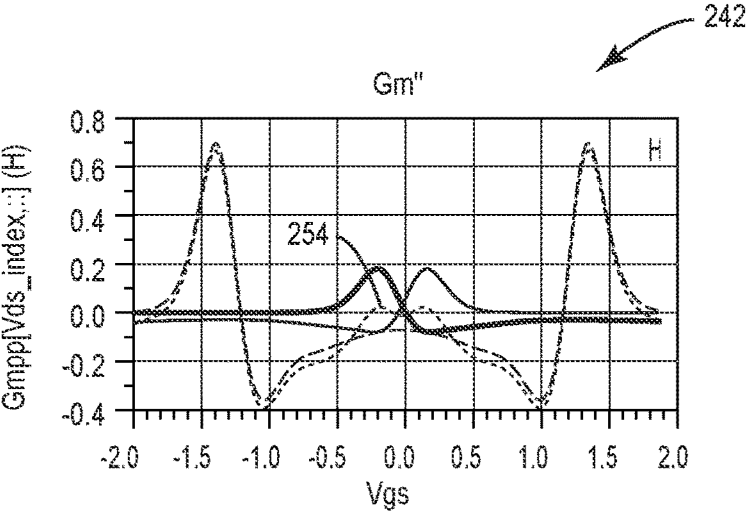
Figures 2K, 2L, 2M:
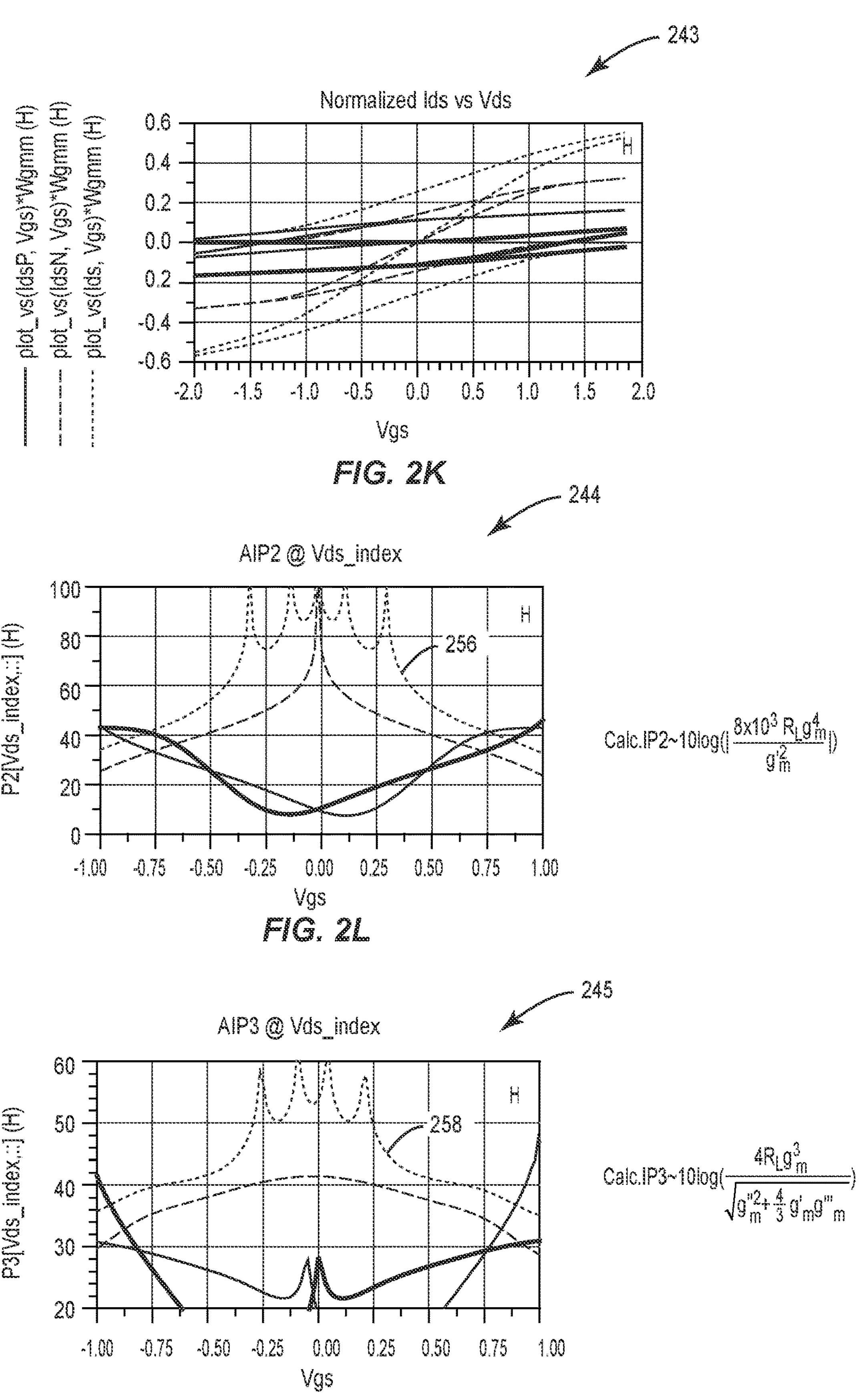

Graph 243 of FIG. 2K illustrates the differential current Multi-Tanh transfer responses for the individual differential pairs. The transfer responses are offset from the Vgs=0 differential input voltage. The combined total differential current is a broader and more linear Multi-Tanh transfer function than the individual components. This combination results in the broad and flat Gm response shown by line 250 in FIG. 2H. Graph 240 of FIG. 2H also gives the individual differential pair Gm responses. By varying the gate lengths (Lg) of each differential pair, Multi-Tanh is used to optimize the individual Gm offset to produce the overall flat and linear Gm response over a wide differential Vgs dynamic range. The corresponding Gm' and Gm" responses of FIGS. 2I and 2J illustrate the resulting flat aggregate Gm' and near zero Gm" response lines 252 and 254, respectively, as well as the individual differential pair contributions. Finally, the aggregate IP2 and IP3 lines 256 and 258, respectively, and the individual component contributions are also given in graphs 244, 245.

The equations for IP2 and IP3 are given in the inset of FIGS. 2L and 2M, and are based on simple two-tone sinusoidal excitations to a Taylor series polynomial characterizing the Gm function of a FET device.

Figure 3:
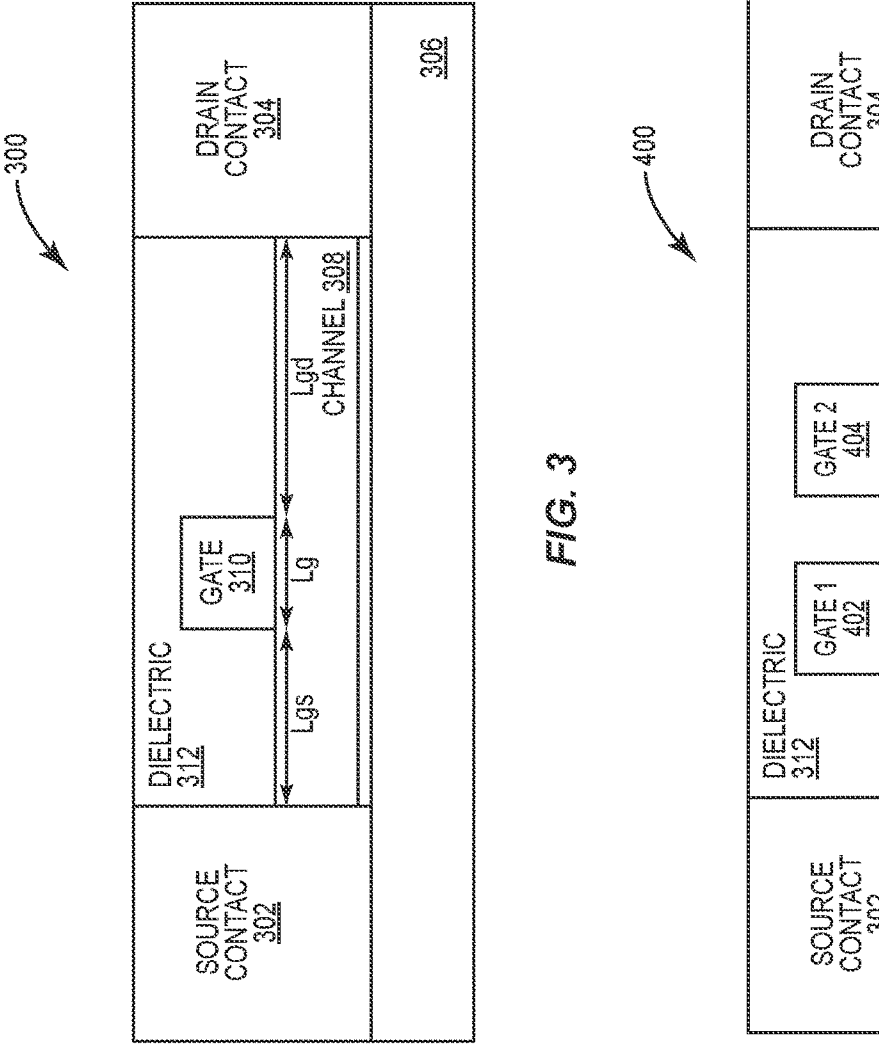
FIG. 3 is a cross-sectional elevation view of a FET illustrating a first gate length that may be varied according to exemplary aspects of the present disclosure.

FIGS. 3-6 better illustrate what is meant by effective gate length. In this regard, FIG. 3 illustrates a FET 300 that has a source 302 and a drain 304 positioned on a semi-insulating substrate 306 such as silicon carbide (SiC), Indium Phosphate (InP), Gallium Arsenide (GaAs), or the like. A channel 308 is positioned between the source 302 and the drain 304. A gate 310 is positioned on the channel 308 and may be surrounded by a dielectric 312. The gate 310 has a gate length Lg corresponding to a lateral dimension of the gate 310 between the source 302 and the drain 304. As illustrated, the gate 310 has a gate width Wg extending into and out of the image. In the FET 300, with only one gate 310, the gate length and the effective gate length are the same.

Figure 4:
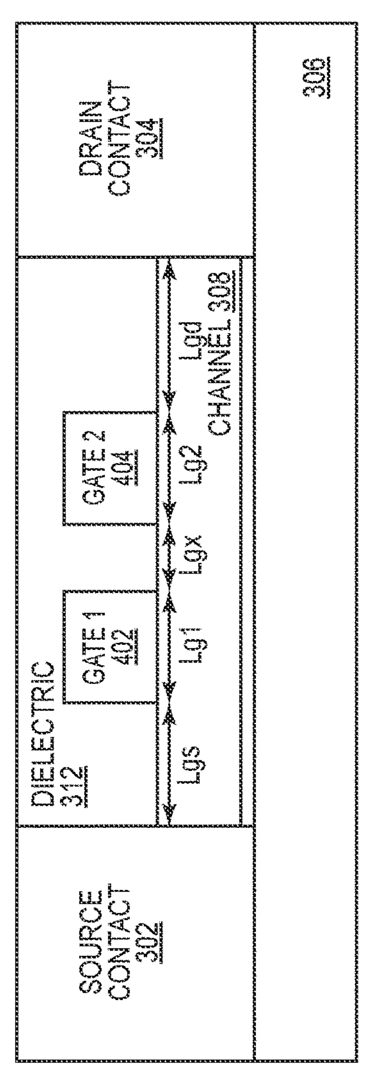
FIG. 4 is a cross-sectional elevation view of a FET having dual gates illustrating an effective gate length that may be varied according to exemplary aspects of the present disclosure.

A slightly more complex FET 400 is illustrated in FIG. 4, where many of the elements are the same, but the gate is a lateral dual gate having gates 402, 404. In the FET 400, the effective gate length is based on the lateral dual gate and more specifically is the sum of a first gate length Lg1 and a second gate length Lg2. The presence of the second gate 404 increases the effective gate length relative to the effective gate length of FET 300 of FIG. 3. Note that the second gate 404 may be biased or floating.

Figures 5, 6A, 6B:
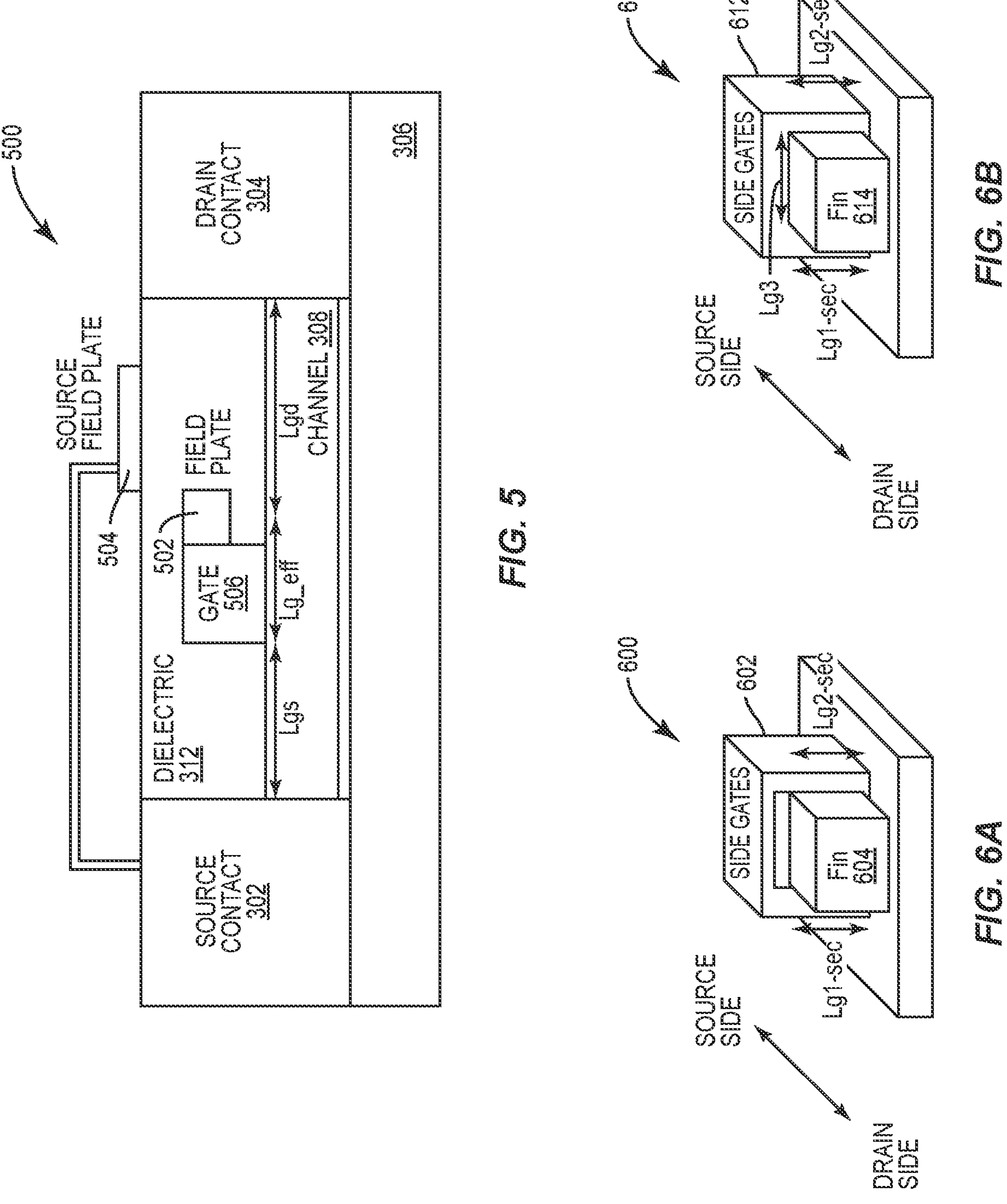
FIG. 5 is a cross-sectional elevation view of a FET having a field plated gate illustrating an effective gate length that may be varied according to exemplary aspects of the present disclosure.
FIGS. 6A and 6B are perspective views of two finFETs having dual gates and triple gate sided/shaped three-dimensional OD) structures illustrating an effective gate length control that may be varied according to exemplary aspects of the present disclosure.

FIG. 5 illustrates still another variation on a gate within a FET 500. Specifically, the FET 500 uses a field plated gate having at least one field plate 502 and a source field plate 504. The effective gate length of the FET 500 is more than just the lateral length of the gate 506, but less than the sum of the lateral length of the gate 506 and the lateral length of the field plate 502.

While not shown, the gate may include various T-cap (thickness) geometries such as an overhang, a dielectric below a T-cap, trunk angle, and the like.

FIG. 6A illustrates an alternate type of FET, namely a finFET 600, which includes at least dual three-dimensional (3D) gate structures 602, which extends over and around a fin 604, which acts as a channel. The gate structures 602 may touch the sides of the fin 604. Note that conventional gate length for a finFET is defined as the direction of the source-drain (in/out of the page). The effective 3D gate length as that term is used herein is defined to be the sum of the sections of the gate that impact the channel threshold voltage in a similar manner as the effective gate length shown in FIGS. 3-5. In particular, the sections that have an impact on the channel threshold voltage are Lg1-sec and Lg2-sec. The effective gate length becomes the sum of the distance over which the gate structures 602 contact the fin 604. Thus, the effective gate length may be the sum of Lg1-sec and Lg2-sec.

FIG. 6B illustrates a similar finFET 610, which includes 31) gate structure 612, which extends over and around a fin 614, which acts as a channel. The gate structures 612 may touch three sides of the fin 614. As with the finFET 600, the effective gate length that controls the channel and its threshold characteristics, for example, is defined somewhat differently than the conventional gate length for a finFET and the sections that impact the channel threshold voltage are Lg1-sec, Lg2-sec, and Lg3-sec. The effective gate length becomes the sum of the distance over which the gate structures 612 contact the fin 604. Thus, the effective gate length may be the sum of Lg1-sec, Lg2-sec, and Lg3-sec.

From the discussion of FIGS. 3-6B it should be appreciated that an effective gate length that controls the channel charge, the effective transconductance, and the threshold characteristics, is not limited to just a lateral distance over which the gate is positioned on a channel, but includes situations where a portion of the gate structure (e.g., the field plate) does not directly touch the channel, but has a material impact on the channel.

Note further, that exemplary aspects of the present disclosure contemplate that one or more of the FETs may have a weighted gate width. This weighting may be done to optimize the linearity and adds an additional degree of freedom for optimizing the resulting shape and effective overall Gm which may be optimized for even and odd order linearity. Selectively increasing the Wg of a single channel or pair of channels of a differential pair will change the weighted Gm contribution to the total effective Gm transfer function. In an exemplary aspect, less than fifteen percent (15%) of the total number of FETs are so weighted. Additionally, such weighting may be done by less than a factor of three and more likely less than a factor of two. Thus, for example in the transconductor 100, two FETs may have gate widths that are eighty percent the size of other gate widths. In an alternate example, two FETs of the transconductor 100 may have gate widths that that are approximately twice the width of other gate widths within the device. Changing the gate width may increase the transconductance of the transconductor 100 as well as change the threshold voltage to assist in meeting design criteria.

FIGS. 7A-7F illustrate graphs 700-705 that show the Gin (S/mm) (graph 700, FIG. 7A), Gm' ($A/V^2$-mm) (graph 701, FIG. 7B), Gm" ($A/V^3$-mm) (graph 702, FIG. 7C), differential Ids (A/mm) (graph 703, FIG. 7D), and calculated. IP2 (dBm) (graph 704, FIG. 7E), and IP3 (dBm) (graph 705, FIG. 7F). In particular, these characteristics of a conventional constant gate length device (shown by line 710 in each of the graphs 700-705) are compared to two different configurations of a multi-gate length Multi-Tanh transconductor 100. A line 712 corresponds to the Lg-Multi-Tanh 2 device shown by the various 208 lines of FIGS. 2A-2G. A third line 714 is similar to the Lg-Multi-Tanh 2 device, but with additionally non-uniform weighted gate widths. Compared to a conventional device, both lines 712 (i.e., Lg-Multi-Tanh 2) and 714 (i.e., Lg-Multi-Tanh 3, with Wg weighting) have flatter curves in graphs 700-702.

Figure 7A:
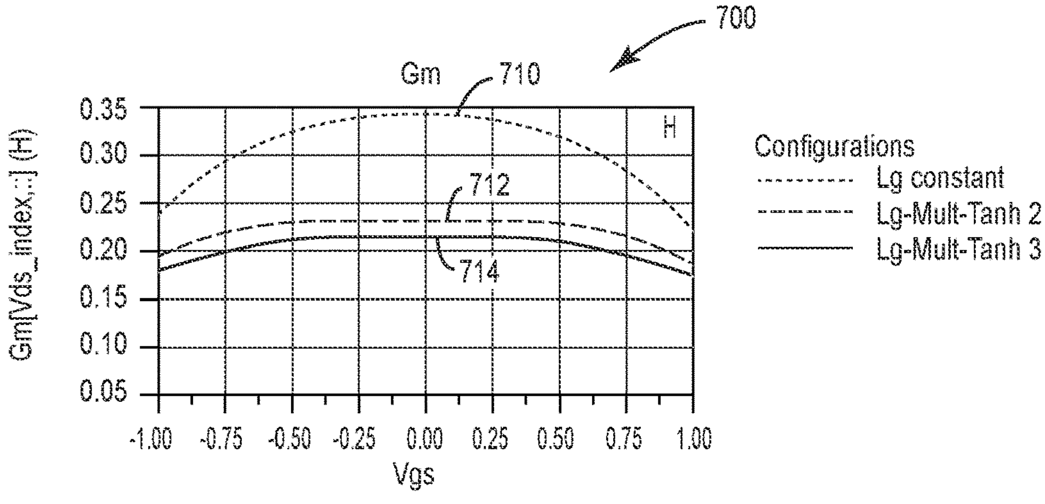
FIGS. 7A-7F are graphs comparing performance characteristics of the conventional transconductor (i.e., Lg-constant) relative to a transconductor formulated according to the parameters set in FIG. 2A Lg-Mult-Tanh 2) and one transconductor that is similar to Lg-Multi-Tanh 2 but with selectively weighted gate widths (i.e., Lg-Mult-Tanh 3)
Figure 7B:
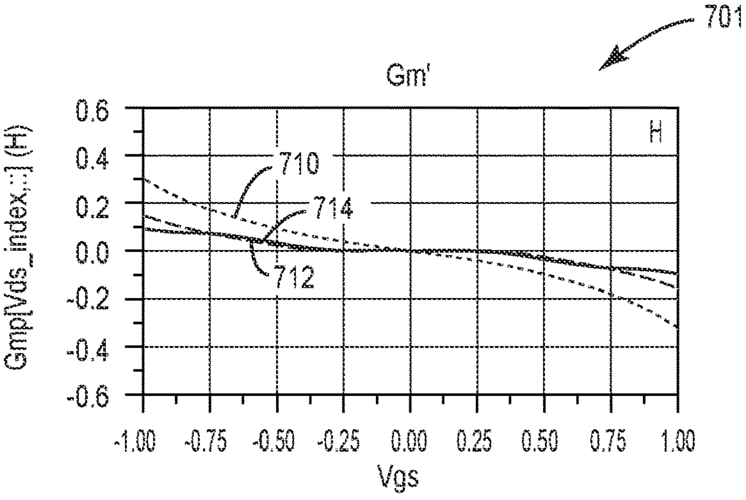
Figure 7C:
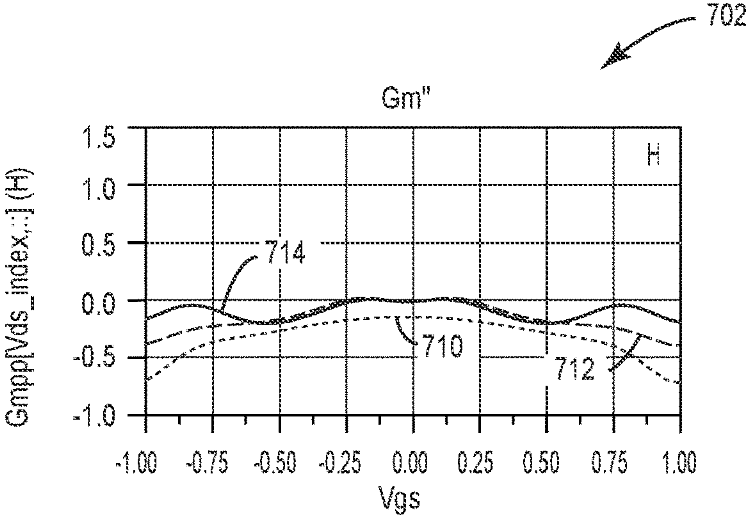
Figure 7D:
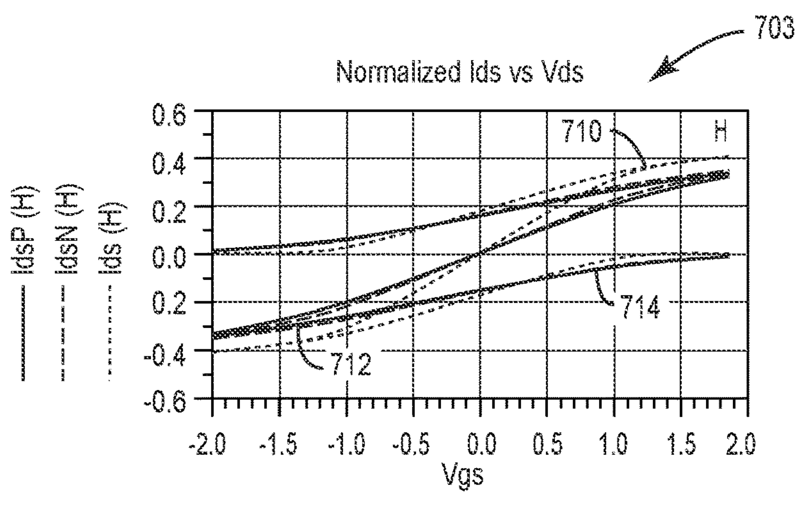
Figure 7E:
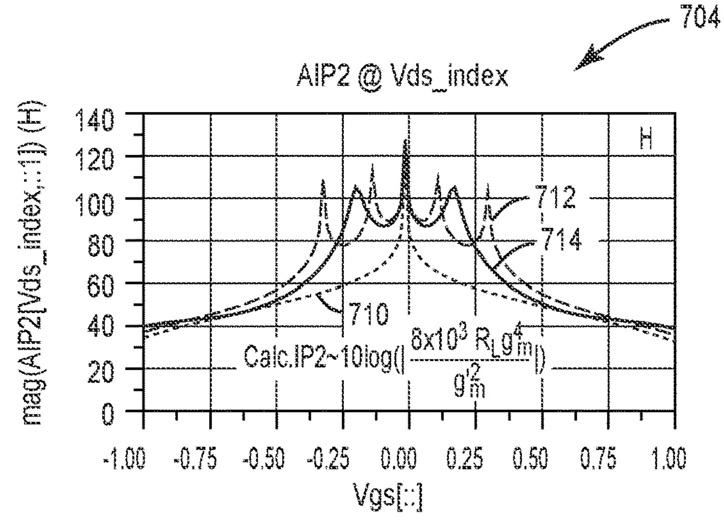
Figure 7F:
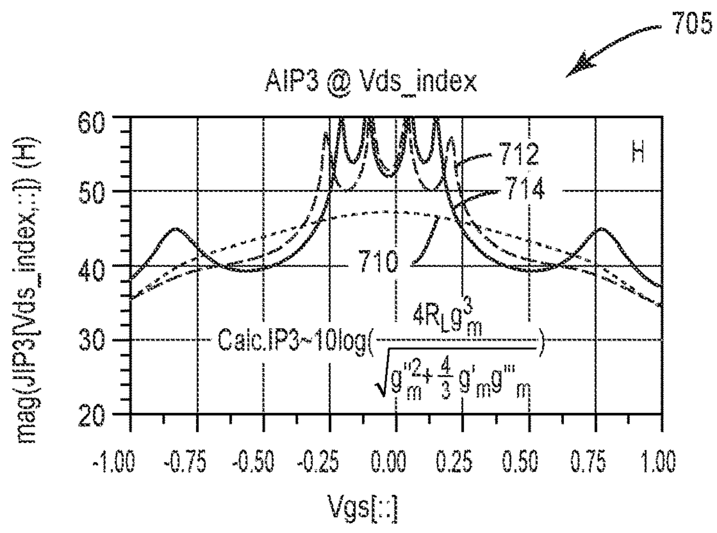

FIGS. 7E and 7F show in graphs 704, 705 that the Lg-Mult-Tanh 3 (with Wg weighting) configuration can achieve both improved IP2 and IP3 simultaneously (again see line 714) with respect to the conventional device (again line 710) and also with respect to the Lg-Mult-Tanh 2 (again, line 712), Thus, the configuration Lg-Mult-Tanh 3 shows improvement both IP2 and IP3 over the Lg-Multi-Tanh 2 but with a slightly smaller differential input voltage range due to the non-uniform Wg weighting function of the Multi-Tanh pairs.

The equations for IP2 and IP3 are given in the inset of FIGS. 7E and 7F and are based on simple two-tone sinusoidal excitations to a Taylor series polynomial characterizing the Gm function of a FET device.

FIGS. 7G-7L are similar to FIGS. 2H-2M, but reflect the individual contributions of the optimized Lg-Multi-Tanh 3 configuration of a device that has non-uniformly weighted gate widths in addition to the varying gate lengths. In particular, FIGS. 7G-7L include graphs 720-725 corresponding to Gm (S/mm) (graph 720, FIG. 7G), Gm' (A/V$^2$-mm) (graph 721, FIG. 7H), Gm" (A/V$^3$-mm) (graph 722, FIG. 7I), differential Ids (A/mm) (graph 723, FIG. 7J), and calculated IP2 (dBm) (graph 724, graph 7K) and IP3 (dBm) (graph 725, FIG. 7L).

Figure 7G:
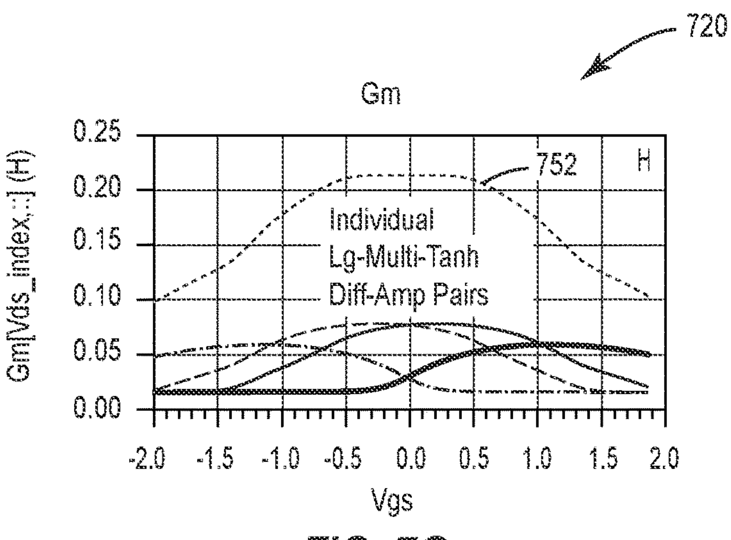
FIGS. 7G-7L are graphs showing the individual paired transistor responses that collectively form one of the lines provided in the graphs in FIGS. 7A-7F.
Figure 7H:
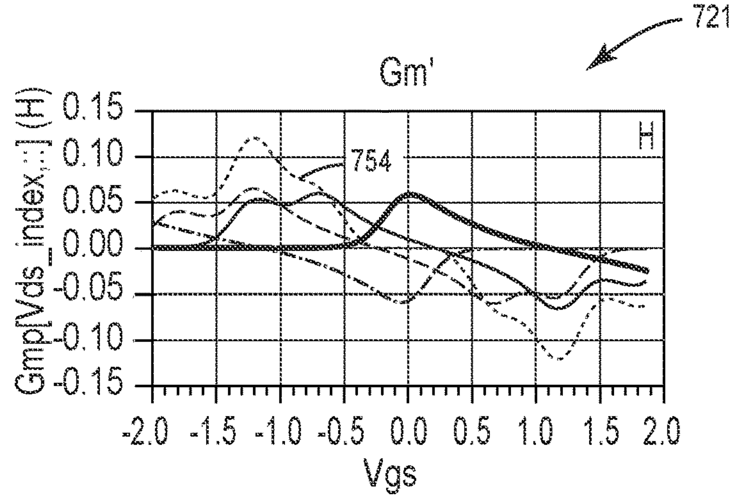
Figure 7I:
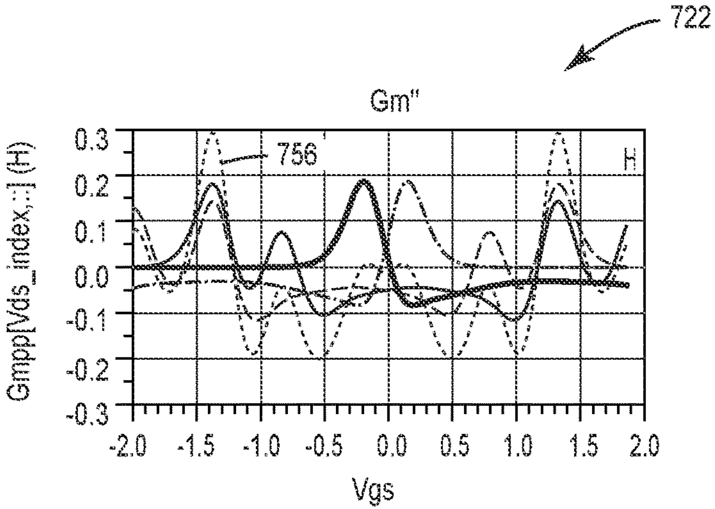
Figures 7J, 7K, 7L:
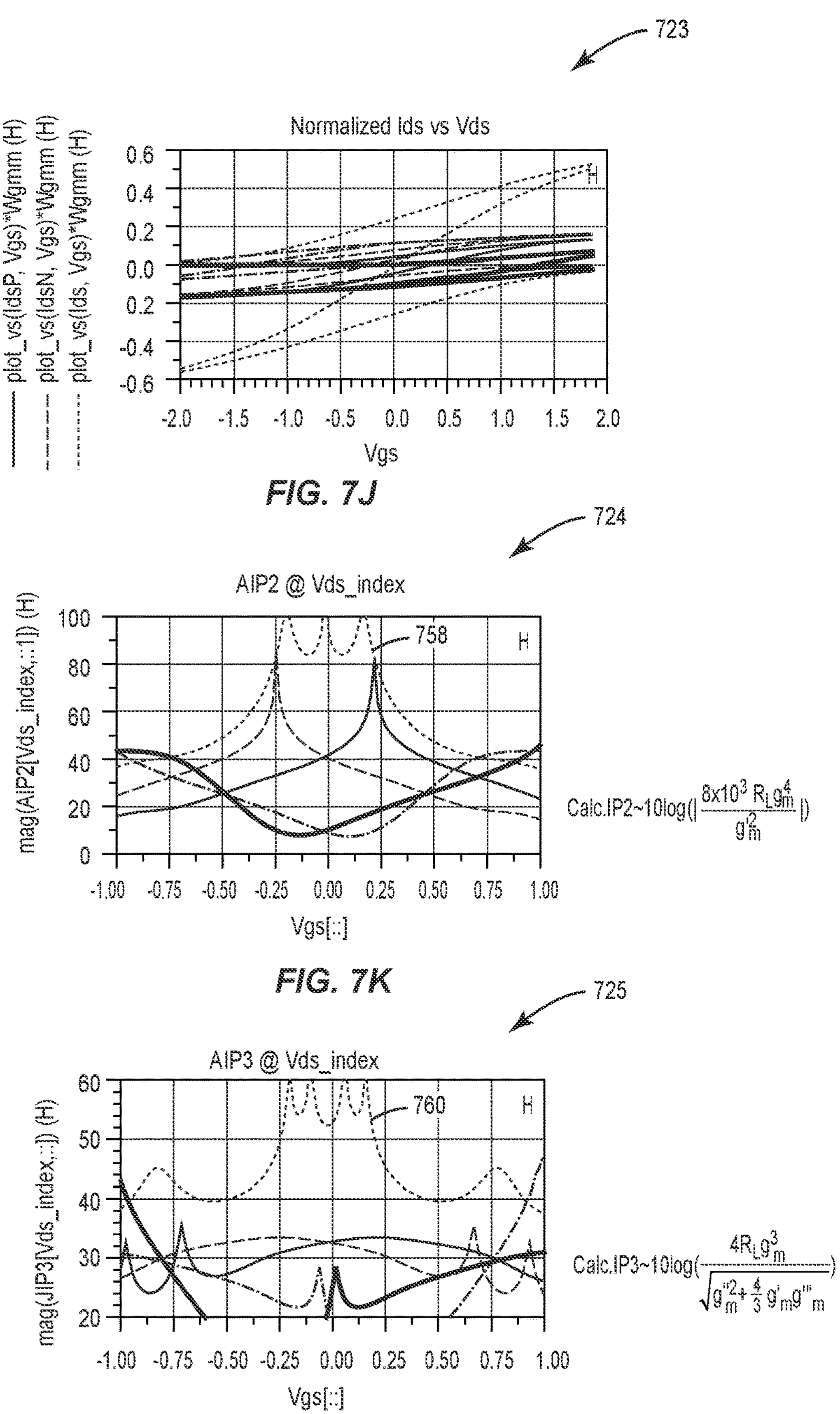

FIG. 7J illustrates the differential current Multi-Tanh transfer responses for the individual differential pairs. The transfer responses are offset from the Vgs=0 differential input voltage. The combined total differential current is a broader and more linear Multi-Tanh transfer function than the individual components. This combination results in the broad and flat Gm response line 752 in FIG. 7G. FIG. 7G also gives the individual differential pair Gm responses. By varying the gate lengths (Lg) of each differential pair, Multi-Tanh is used to optimize the individual Gm offset to produce the overall flat and linear Gm response over a wide differential Vgs dynamic range. When the varied gate lengths are combined with selectively optimizing the gate width (Wg) weighting of the individual transistors, a more optimized response may be achieved. The corresponding Gm' and Gm" responses of FIGS. 7H and 7I illustrate the resulting flat aggregate Gm' and near zero Gm" responses (lines 754, 756, respectively) as well as the individual differential pair contributions. Finally, the aggregate IP2 and IP3 lines 758 and 760 and the individual component contributions are given in FIGS. 7K and 7I.

The equations for IP2 and IP3 are given in the inset of FIGS. 7K and 7I, and are based on simple two-tone sinusoidal excitations to a Taylor series polynomial characterizing the Gm function of a FET device.

The FET transconductance device with varying gate lengths according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

The previous description of the disclosure is provided to enable any person skilled in the art to make or use the disclosure. Various modifications to the disclosure will be readily apparent to those skilled in the art, and the generic principles defined herein may be applied to other variations. Thus, the teachings of the disclosure are not intended to be limited to the examples and designs described herein but is to be accorded the widest scope consistent with the principles and novel features disclosed herein, and the only limitations to be found are those set forth within the claims.

What is claimed is:

1. A transconductor comprising:
- a first voltage level input;
- a first plurality of field effect transistors (FETs), each of the first plurality of FETs coupled to the first voltage level input and electrically parallel to one another, the first plurality of FETs comprising:
  - a first FET comprising a first source and a first effective gate length, wherein the first effective gate length includes a first variable other than gate length that controls effective transconductance; and
  - a second FET comprising a second source and a second effective gate length different than the first effective gate length, wherein the second effective gate length includes the first variable other than gate length that controls the effective transconductance;
- a second voltage level input; and
- a second plurality of FETs, equal in number to the first plurality of FETs, each of the second plurality of FETs coupled to the second voltage level input and electrically parallel to one another, the second plurality of FETs comprising:
  - a third FET comprising a third source coupled to the first source and a third effective gate length equal to the second effective gate length; and
  - a fourth FET comprising a fourth source coupled to the second source and a fourth effective gate length equal to the first effective gate length.

2. The transconductor of claim 1, wherein the first FET and the third FET collectively form a first differential amplifier.

3. The transconductor of claim 2, wherein the first source and the third source are coupled to a common potential.

4. The transconductor of claim 3, wherein the common potential comprises a virtual ground.

5. The transconductor of claim 3, wherein the common potential is coupled to a ground through a resistor.

6. The transconductor of claim 3, wherein the common potential is coupled to a ground through an active current source.

7. The transconductor of claim 1, wherein the second FET and the fourth FET collectively form a differential amplifier.

8. The transconductor of claim 1, wherein the first FET comprises a first gate and the second FET comprises a second gate, wherein the first gate and the second gate are coupled to a common input node.

9. The transconductor of claim 1, wherein the first FET comprises a first drain and the second FET comprises a second drain, wherein the first drain and the second drain are coupled to a common output node.

10. The transconductor of claim 1, wherein the third FET comprises a third gate and the fourth FET comprises a fourth gate, wherein the third gate and the fourth gate are coupled to a second common input node.

11. The transconductor of claim 1, wherein the third FET comprises a third drain and the fourth FET comprises a fourth drain, wherein the third drain and the fourth drain are coupled to a second common output node.

12. The transconductor of claim 2, further comprising a third differential amplifier comprising a fifth FET comprising a fifth effective gate length and a sixth FET comprising a sixth effective gate length, wherein the fifth effective gate length equals the sixth effective gate length.

13. The transconductor of claim 1, wherein the first FET comprises a lateral dual gate and the first variable of the first effective gate length is based on the lateral dual gate.

14. The transconductor of claim 1, wherein the first FET comprises a single gate with at least one field plate, and the first variable of the first effective gate length is based on the single gate with the at least one field plate.

15. The transconductor of claim 1, wherein the first FET comprises a finFET, and the finFET comprises at least two sections of three-dimensional (3D) gate structures, and the first variable of the first effective gate length corresponds to an effective gate control and is based on the at least two sections.

16. The transconductor of claim 15, wherein the first variable of the effective gate length is based on a length dimension of the at least two sections.

17. The transconductor of claim 1, wherein the first FET comprises a finFET, and the finFET comprises three sections of three-dimensional (3D) gate structures, and the first variable of the first effective gate length corresponds to an effective gate control and is based on the three sections.

18. The transconductor of claim 1, wherein the first FET comprises a first gate width and the second FET comprises a second gate width different than the first gate width.

19. The transconductor of claim 18, wherein the third FET has a third gate width equal to the second gate width and the fourth FET has a fourth gate width equal to the first gate width.

* * * * *